(12) United States Patent
Gujer et al.

(10) Patent No.: US 6,776,875 B2
(45) Date of Patent: Aug. 17, 2004

(54) SEMICONDUCTOR SUBSTRATE SUPPORT ASSEMBLY HAVING LOBED O-RINGS THEREIN

(75) Inventors: Rudolf Gujer, Saratoga, CA (US); Thomas K. Cho, Palo Alto, CA (US); Tetsuya Ishikawa, Santa Clara, CA (US)

(73) Assignee: Applied Materials Inc., Santa Clara, CA (US)

( * ) Notice: Subject to any disclaimer, the term of this patent is extended or adjusted under 35 U.S.C. 154(b) by 169 days.

(21) Appl. No.: 09/797,217

(22) Filed: Feb. 28, 2001

(65) Prior Publication Data

US 2002/0007785 A1 Jan. 24, 2002

Related U.S. Application Data

(60) Provisional application No. 60/185,283, filed on Feb. 28, 2000.

(51) Int. Cl.$^7$ .............................. C23F 1/00; H01I 21/306
(52) U.S. Cl. .................. 156/345.51; 118/715; 118/728; 118/733; 156/345.23; 156/345.51
(58) Field of Search ................................. 118/715, 733, 118/728; 156/345.23, 345.21, 345.51; 414/935

(56) References Cited

U.S. PATENT DOCUMENTS

| | | | | |
|---|---|---|---|---|
| 4,037,623 A | * | 7/1977 | Beswick | 137/599 |
| 4,564,622 A | * | 1/1986 | Albin | 526/247 |
| 5,569,350 A | * | 10/1996 | Osada et al. | 156/345.51 |
| 5,578,167 A | * | 11/1996 | Sooriakumar et al. | 438/745 |
| 5,665,166 A | * | 9/1997 | Deguchi et al. | 118/723 E |
| 5,810,933 A | * | 9/1998 | Mountsier et al. | 118/724 |
| 5,950,723 A | * | 9/1999 | Heimanson et al. | 165/275 |
| 6,231,726 B1 | * | 5/2001 | Suemitsu et al. | 204/192.12 |

OTHER PUBLICATIONS

USSN 09/797,161, filed Feb. 28, 2001, entitled Chemical Vapor Deposition Chamber Lid Assembly.
USSN 09/797,214, filed Feb. 28, 2001, entitled Semiconductor Wafer Support Lift–Pin Assembly.
USSN 09/797,211, filed Feb. 28, 2001, entitled Chemical Vapor Deposition Chamber.
USSN 09/721,060, filed Nov. 21, 2000, entitled Apparatus For Cleaning a Semiconductor Process Chamber.

* cited by examiner

Primary Examiner—Parviz Hassanzadeh
Assistant Examiner—Karla Moore
(74) Attorney, Agent, or Firm—Moser, Patterson & Sheridan

(57) ABSTRACT

A semiconductor wafer processing substrate support assembly, comprises a substrate support platform having a centrally disposed recess, coupled to a base disposed above the centrally disposed recess, a plate disposed above the base, and a substrate support disposed above the plate. The substrate support assembly further comprises a plurality of o-rings having a plurality of lobes, wherein a first lobed o-ring of the plurality of lobed o-rings is disposed between the support platform and the base, a second lobed o-ring is disposed between the base and the plate, and a third lobed o-ring is disposed between the plate and the substrate support. Moreover, the plurality of lobed o-rings are utilized in the support assembly for reducing the number of o-rings required in the support assembly.

25 Claims, 7 Drawing Sheets

SEMICONDUCTOR SUBSTRATE SUPPORT ASSEMBLY HAVING LOBED O-RINGS THEREIN

CROSS REFERENCE

This application claims benefit of United States Provisional Application No. 60/185,283, filed Feb. 28, 2000, which is hereby incorporated by reference in its entirety.

BACKGROUND OF THE DISCLOSURE

1. Field of Invention

The present invention relates generally to apparatus for processing semiconductor wafers. More specifically, the invention relates to a semiconductor substrate support assembly.

2. Description of the Background Art

Integrated circuits have evolved into complex devices that include millions of transistors, capacitors and resistors on a single chip. The evolution of chip designs continually requires faster circuitry and greater circuit density. As the demand for integrated circuits continue to rise, chip manufactures have demanded semiconductor process tooling having increased wafer throughput and greater product yield. To meet this increase in throughput, tooling is being developed to process wider diameter wafers, for example, wafers having diameters of 300 millimeters (mm).

Processing chambers generally capable of processing 200 mm wafers typically comprise a semiconductor wafer support assembly further comprising a puck such as and electrostatic chuck, temperature controlling base having a cooling plate and heating electrodes, and a support pedestal. Other various components, such as gas lines, electrical lines, backside gas conduits, and the like are also disposed in the semiconductor wafer support assembly. During the manufacture of such semiconductor wafer support assembly, numerous o-rings are required between the components in the support assembly to sustain a vacuum tight seal between an internal chamber environment and the external environment. The o-rings also prevent the hostile plasma or chemical environment present in the chamber during processing from penetrating and attacking wafer support components. For example, the 200 mm deposition chamber such as the model HDPCVD ULTIMA™ of Applied Materials, Inc. utilizes 16 o-rings to assemble and mount a semiconductor wafer support assembly. Another problem that has been observed when utilizing o-rings is that they are subject to deterioration and outgassing after repeated processing cycles in the chamber. Constant thermal and/or chamber pressure cycling erodes the elastic properties of the o-rings. Minute particles from the o-ring eventually begin to flake off. Such flaking generates contaminants that are undesirable, since they can drift onto a wafer during processing. These contaminants can subsequently create shorts or voids in the devices formed in the processed wafer thereby degrading the quality of the wafer.

Therefore, there is a need in the art for a deposition process chamber that minimizes the risk of particle contamination in the chamber from the o-rings. Furthermore, there is a need for maintaining the integrity of the vacuum seal, while protecting the internal components of the semiconductor wafer support assembly from the hostile chamber environment. Moreover, it would be desirable for such a system to minimize the number of components, maximize seal life and provide ease of serviceability.

SUMMARY OF INVENTION

The disadvantages associated with the prior art are overcome by the present invention of semiconductor substrate processing system. The semiconductor processing system generally comprises a chamber body that has a plurality of sidewalls. At least one support arm extends radially inwards coupled to a semiconductor wafer processing substrate support assembly. The substrate support assembly is centrally disposed on the support arm, and comprises a substrate support platform having a centrally disposed recess, a base disposed above the centrally disposed recess, a plate disposed above the base, and a substrate support disposed above the plate.

The substrate support assembly further comprises a plurality of o-rings having a plurality of lobes, wherein a first lobed o-ring of the plurality of lobed o-rings is disposed between the support platform and the base, a second lobed o-ring is disposed between the base and the plate, and a third lobed o-ring is disposed between the plate and the substrate support. Moreover, the lobed o-rings are utilized in the support assembly for reducing the number of o-rings required in the support assembly.

BRIEF DESCRIPTION OF DRAWINGS

The teachings of the present invention can be readily understood by considering the following detailed description in conjunction with the accompanying drawings, in which.

To facilitate understanding, identical reference numerals have been used, where possible, to designate identical element that are common to the figures.

DETAIL DESCRIPTION OF INVENTION

The present invention generally provides an apparatus for processing a semiconductor substrate. The invention is illustratively described below as a chemical vapor deposition chamber, such as an ULTIMA® High Density Plasma Chemical Vapor Deposition (HDP-CVD) chamber system, available from Applied Materials, Inc. of Santa Clara, Calif. However, it should be understood that the invention may be incorporated into other chamber configurations such as physical vapor deposition chambers, etch chambers, ion implant chambers and other semiconductor processing chambers.

Figure 1:
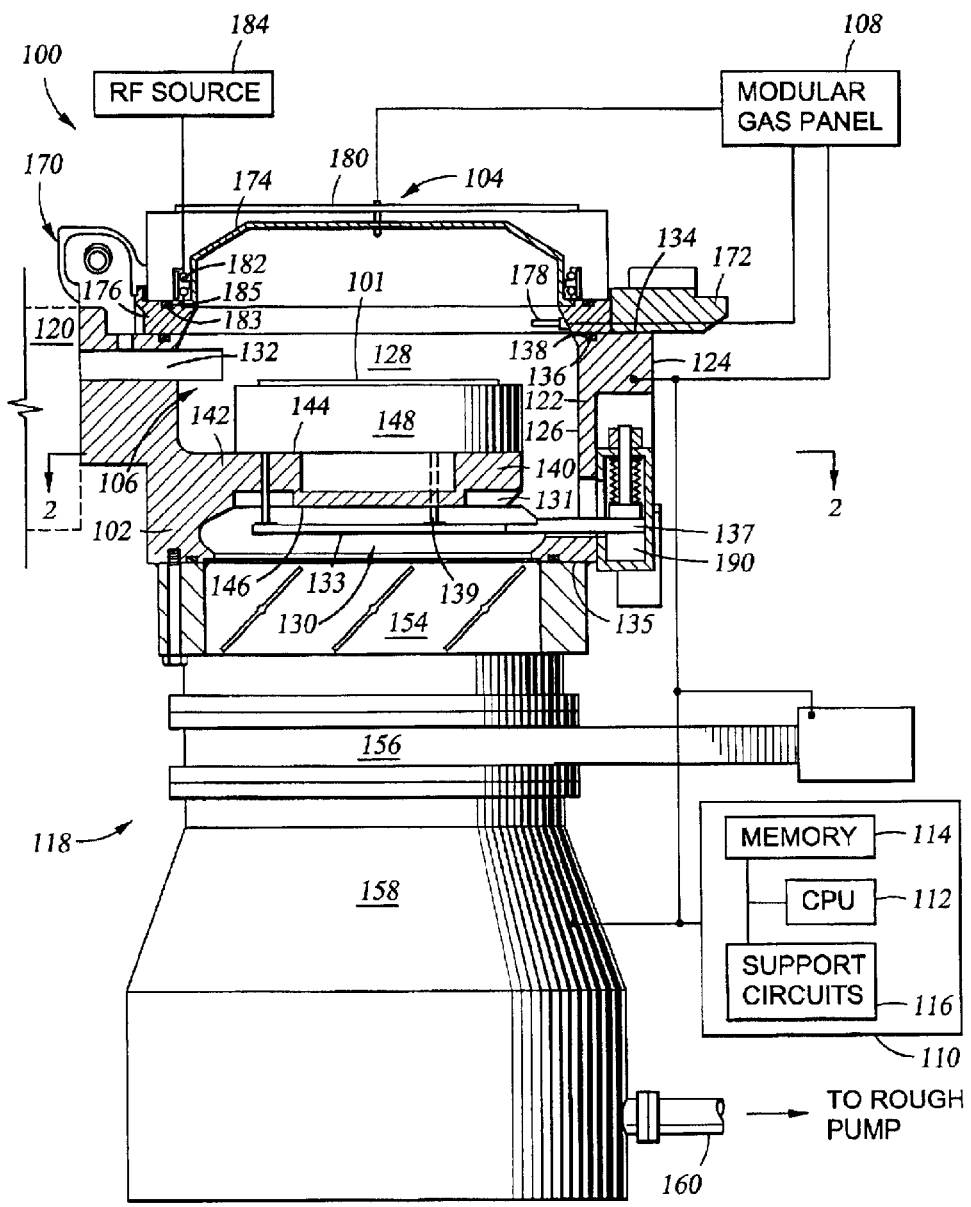
FIG. 1 depicts a cross sectional view of a semiconductor processing system of the present invention.

FIG. 1 depicts a partial cross section of a semiconductor processing chamber 100 of the present invention. Specifically, FIG. 1 depicts an illustrative HDP-CVD chamber system (system) 100 that generally comprises a chamber body 102 and a lid assembly 104 that defines an evacuable chamber 106 for carrying out substrate processing. The chamber system 100 may be one a number of substrate processing systems that are coupled to a processing platform 120 such as a CENTURA® processing platform, available from Applied Materials, Inc.

The system 100 includes a pumping stack 118, a modular gas panel 108 and a controller 110. The controller 110 has a central processing unit (CPU) 112, memory 114, and support circuits 116. The controller 110 is coupled to the various components of the system 100 to facilitate control of the deposition process. The chamber body 102 is typically a unitary, machined structure fabricated from aluminum. The chamber body 102 has a plurality of sidewalls 122 having a substantially rectangular outside surface 124 and an annular, inner surface 126. The annular, inner surface 126 of the chamber body 102 generally tapers to define an exhaust passage 130. Furthermore, at least one sidewall 122 is electrically grounded (not shown). The chamber body 102 contains a substrate entry port 132 that is selectively sealed by a slit valve (not shown) disposed in the processing platform 120.

A substrate support platform 140 is coupled to the sidewall 122 by one or more support arms 142 (only one shown). The support arms 142 extend radially between the support platform 140 and the sidewall 122, positioning the support platform 140 in the center of the chamber 106. The support platform 140 comprises a first surface 144 for supporting a support assembly 148 and a second surface 146 that faces the exhaust passage 130. A substantially C-shaped slot 131 circumscribes the second surface 146 to provide room for a lift-pin arm 133 having a distal end 137, which is coupled to an actuator assembly 190. The lift-pin arm 133 actuates a plurality of lift-pins 139 during wafer processing. For a detailed understanding of the C-shaped slot 131, lift-pin arm 133, lift-pins 139, and actuator assembly 190, the reader should refer to the drawings and the detailed description in commonly assigned U.S. application titled "Semiconductor Wafer Support Lift-pin Assembly", Ser. No. 09/797,214, authored by Gujer et al., Docket No. 4352/PDD/KPU3/JW, filed concurrently with this application, and incorporated herein by reference.

A first surface 134 of the chamber body 102 defines a generally flat landing area on which the lid assembly 104 is supported. An o-ring groove 136 is formed in the first surface 134 of the sidewall 122 to receive an o-ring 138 that forms a gas-tight seal between the chamber body 102 and the lid assembly 104. Typically, the o-ring 138 is fabricated from a fluoropolymer or other material compatible with the processing environment such as CHEMREZ™. For a detailed The lid assembly 104 generally includes a lid 172, a hinge assembly 170, a dome 174 and a gas distribution ring 176. The lid 172 is coupled the dome 174 and gas distribution ring 176. The lid 172 is typically fabricated from aluminum. For a detailed understanding of the lid assembly 104, the reader should refer to the drawings and the detailed description in commonly assigned U.S. application titled "Chemical Vapor Deposition Chamber Lid Assembly", authored by Pang et al., Docket No. 4352-5/PDD/KPU3/JW, filed concurrently with this application, and incorporated herein by reference. That patent teaches a lid having a dual pivot hinge assembly, which is manufactured by Applied Materials, Inc. of Santa Clara, Calif. Together, the dome 174, sidewalls 122, and substrate support assembly 148 define a processing region 128.

At least one antenna or coil 182 is wound external to the dielectric dome 174. The coil 182 is powered by a variable frequency RF power source 184. The RF power source 184 includes a RF matching network to transfer power to plasma generated in the processing region 128. Disposed above the dome 174 is a temperature control assembly (not shown) that is utilized to regulate the temperature of the dome 174 during the various process cycles, i.e., deposition cycle and cleaning cycle. Typically, the dome 174 is heated during cleaning cycles and cooled during processing. A temperature control assembly in a semiconductor wafer processing system is disclosed in U.S. patent application, Ser. No. 09/721,060, titled "APPARATUS FOR CLEANING A SEMICONDUCTOR PROCESS CHAMBER", filed Nov. 21, 2000, and assigned to the same assignee as the present application, Applied Materials, Inc., of Santa Clara, Calif. This patent application is incorporated by reference as if fully reproduced herein.

The gas distribution ring 176 is disposed between the dome 174 and the chamber body 102. The gas distribution ring 176 typically comprises an annular ring made of aluminum or other suitable material having a plurality of ports (not shown) formed therein for receiving nozzles 178 that are in communication the gas panel 108. The gas panel 108 may alternately be coupled to the chamber 106 via a showerhead or second nozzle 180 disposed beneath the dome 174. Optionally, both a showerhead and gas distribution ring 176 may be used in conjunction with each other. The gas panel 108 provides process and other gases to the chamber 106.

Opposite the first surface 134 of the chamber body 102 upon which the lid assembly 104 is disposed, is a second surface 135. Disposed centrally in the second surface 135 is the exhaust passage 130. The second surface 135 defines a generally flat landing area that abuts the pumping stack 118 that communicates with the exhaust passage 130. The pumping stack 118 includes a throttle valve assembly 154, a gate valve 156 and a turbomolecular pump 158. The pumping stack 118 is mounted to the exhaust passage 130 of the chamber body 102 to provide pressure control within the system 100. A line 160 couples the turbomolecular pump 158 to a remote mainframe or roughing pump (not shown). The roughing pump evacuates the chamber 106 to a vacuum level within the operational range of the turbomolecular pump 158.

Figure 2:
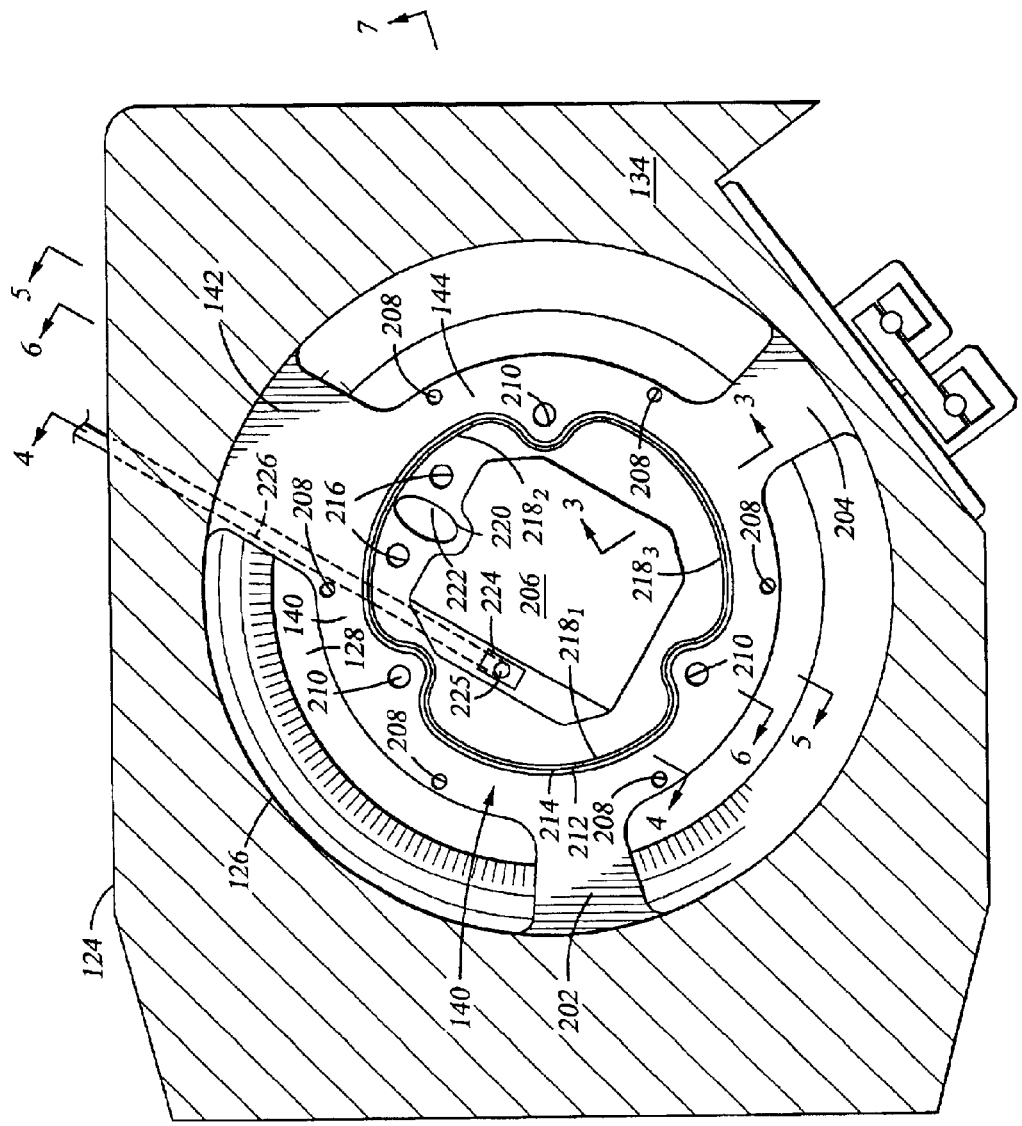
FIG. 2 depicts a cross sectional view of a chamber body as taken along section line 2—2 of FIG. 1.
Figure 3:
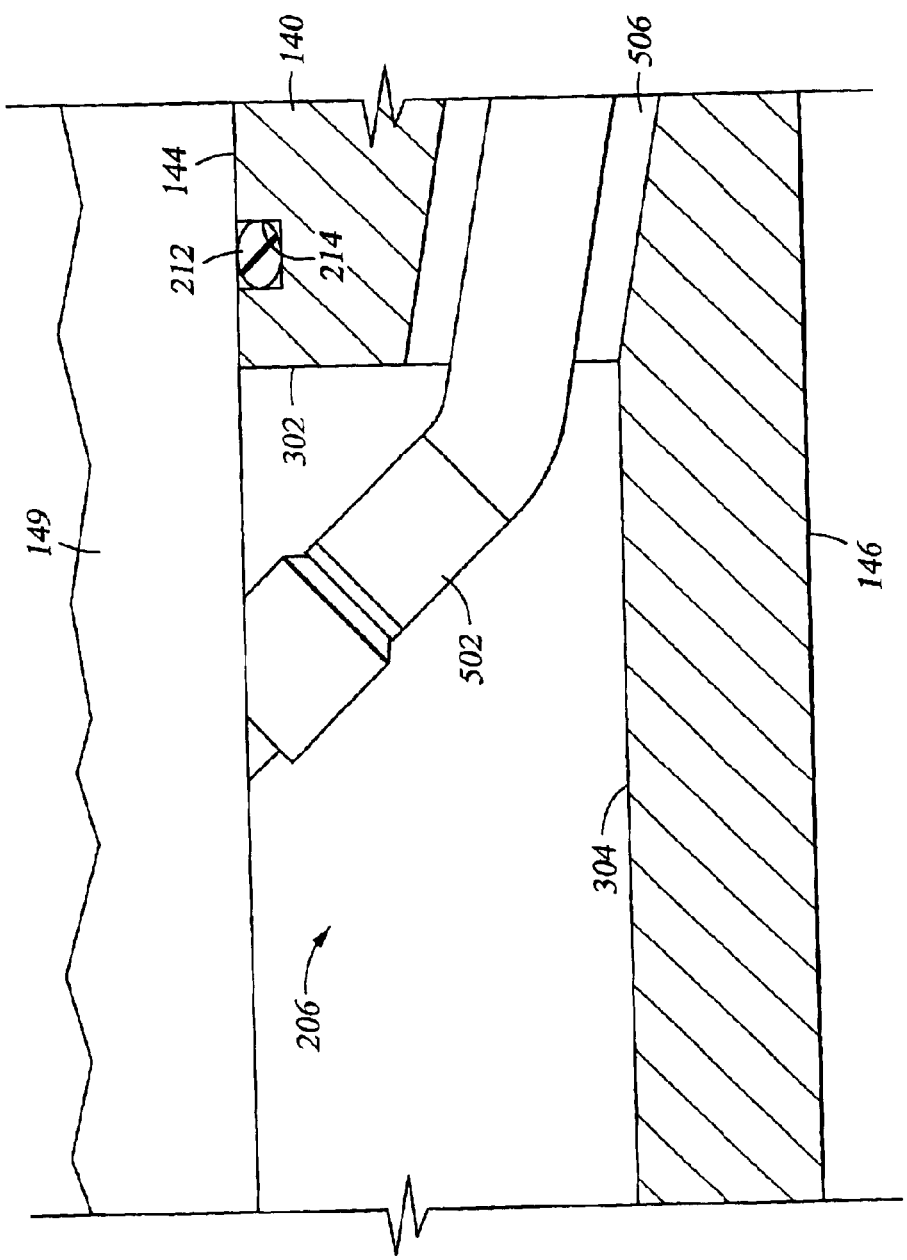
FIG. 3 depicts a partial cross-sectional view of the chamber body having a centrally disposed recess as taken along section line 3—3 of FIG. 2.

FIG. 2 depicts a top view of a chamber body 102 as taken along section line 2—2 of FIG. 1. Furthermore, FIG. 3 depicts a partial cross-sectional view of the chamber body 102 having a centrally disposed recess 206, as taken along section line 3—3 of FIG. 2. Referring to FIGS. 2 and 3 together, the first surface 144 of the support platform 140 has a centrally disposed recess 206. The recess 206 is defined by a plurality of walls 302 (e.g., 4 walls), which extend from the first surface 144 to a bottom 304. The first surface 144 additionally comprises a plurality of a threaded mounting holes 208 and a plurality of lift-pin holes 210. In one embodiment, the support platform 140 contains six mounting holes 208 and three lift-pin holes 210. The mounting holes 208 are typically blind holes while the lift-pin holes 210 generally extend through the support platform 140 such that a lower end of the lift-pin hole 210 exits the second surface 146 and is exposed to the exhaust passage 130.

A lobed o-ring 212 is disposed in a conforming o-ring groove 214 formed in the first surface 144. The lobed o-ring 212 is a generally circular, flexible, sealing member, which is fabricated from a fluoropolymer or other material compatible with the processing environment such as CHEMREZ™. The lobed o-ring 214 provides a seal that separates the environment of the processing region 128 from the typical atmospheric environment of the recess 206. The lobed o-ring 212 passes radially inward of the lift-pin holes 210. The lobed o-ring 212 is generally clover shaped and includes a plurality of lobes 218 (e.g., lobes $218_1$, $218_2$, and $218_3$), which are spaced about the circular structure and are disposed radially outward such that a greater area of the first surface 144 is isolated from the processing region 128.

For example, a pair of wafer backside gas passages 216 are disposed through the support platform 140 in the area located radially inwards of one of the lobes 218 of the first surface 144. Likewise, a wafer temperature probe cable 224, such as a fiber optic cable, is disposed through the support platform 140 in the area located radially inwards of one of the lobes 218 of the first surface 144. Furthermore, a first end 220 of a RF conduit 222 is disposed through the support platform 140 in the area located radially inwards of one of the lobes 218 of the first surface 144. As such, the pair of wafer backside gas passages 216, the wafer temperature probe cable 224, and the first end 220 of the RF conduit 222 passes through the first surface 144 without requiring additional o-rings to isolate these components from the processing region 128.

Moreover, the lift-pin holes 210 are on the processing region side of the lobed o-ring 212, and accordingly, do not require additional o-rings to prevent the processing environment from entering the recess 206. Thus, the lobed o-ring 212 reduces the number of ordinary o-rings required. Additionally, with fewer o-rings, the tolerance sensitivity among the o-rings is reduced, thereby allowing for enhanced seal reliability and improved parallelism between sealing surfaces.

Figure 7:
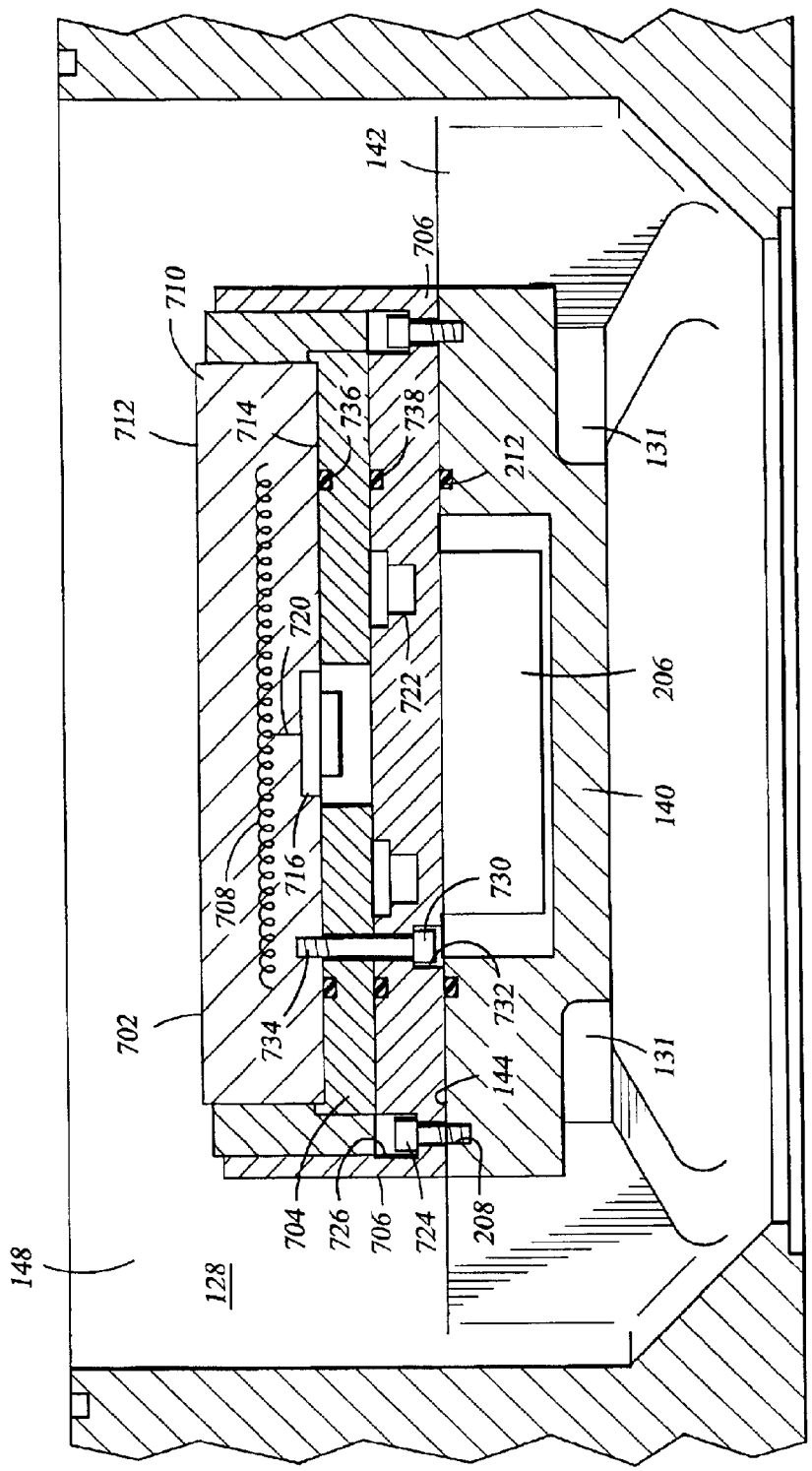
FIG. 7 depicts a cross sectional view of a substrate support assembly as taken along section line 7—7 of FIG. 2.

FIG. 7 depicts a cross sectional view of the substrate support assembly 148 as taken along section line 7—7 of FIG. 2. Specifically, FIG. 7 depicts the substrate support assembly 148 concentrically disposed on the first surface 144 of the support platform 140. The substrate support assembly 148 generally comprises a substrate support (shown as an electrostatic chuck 702), a plate 704, and a base 706. The substrate support 702 may be a susceptor, a heater, ceramic body, or electrostatic chuck on which the substrate or wafer is placed during processing.

The electrostatic chuck 702 generally comprises a ceramic body 710 having a support surface 712 and an opposing second surface 714. The electrostatic chuck 702 generally includes at least one electrode 708 embedded within the ceramic body 710. The electrode 708 is electrically coupled to a contact pad 716 disposed on the second surface 714 via a conductive feedthrough 720. The base 706 generally comprises a molybdenum or stainless steel body having a plurality of cooling fluid channels 722 disposed therein.

The plate 704 is disposed between the electrostatic chuck 702 and the base 706. The plate 706 is fabricated from a dielectric material such as ceramic, and generally includes a plurality of passages to permit access to the electrostatic chuck and support surface. The individual passages, o-rings, and reference numerals have been omitted for the sake of clarity. The base 706 is fastened to the support platform 140 utilizing a plurality of bolts 724 that pass through a corresponding hole 726 in the base 706 and into the threaded mounting hole 208 disposed in the support platform 140.

The support assembly 148 is secured together by threaded fasteners 730 (e.g., bolt), one of which is shown. The threaded fastener 730 extends from a counter-bored hole 732 in the base 706, passing through the plate 704 and into a threaded hole 734 in the electrostatic chuck 702. A second lobed o-ring 736 and a third lobed o-ring 738, configured substantially identical to the lobed o-ring 212, are disposed respectively between the plate 704 and electrostatic chuck 702, and base 706 and plate 704. Generally, each lobed o-ring 736, 738 reduces the number of o-rings required between the base 706, plate 704 and electrostatic chuck 702 as described above with reference to the lobed o-ring 212.

Figure 4:
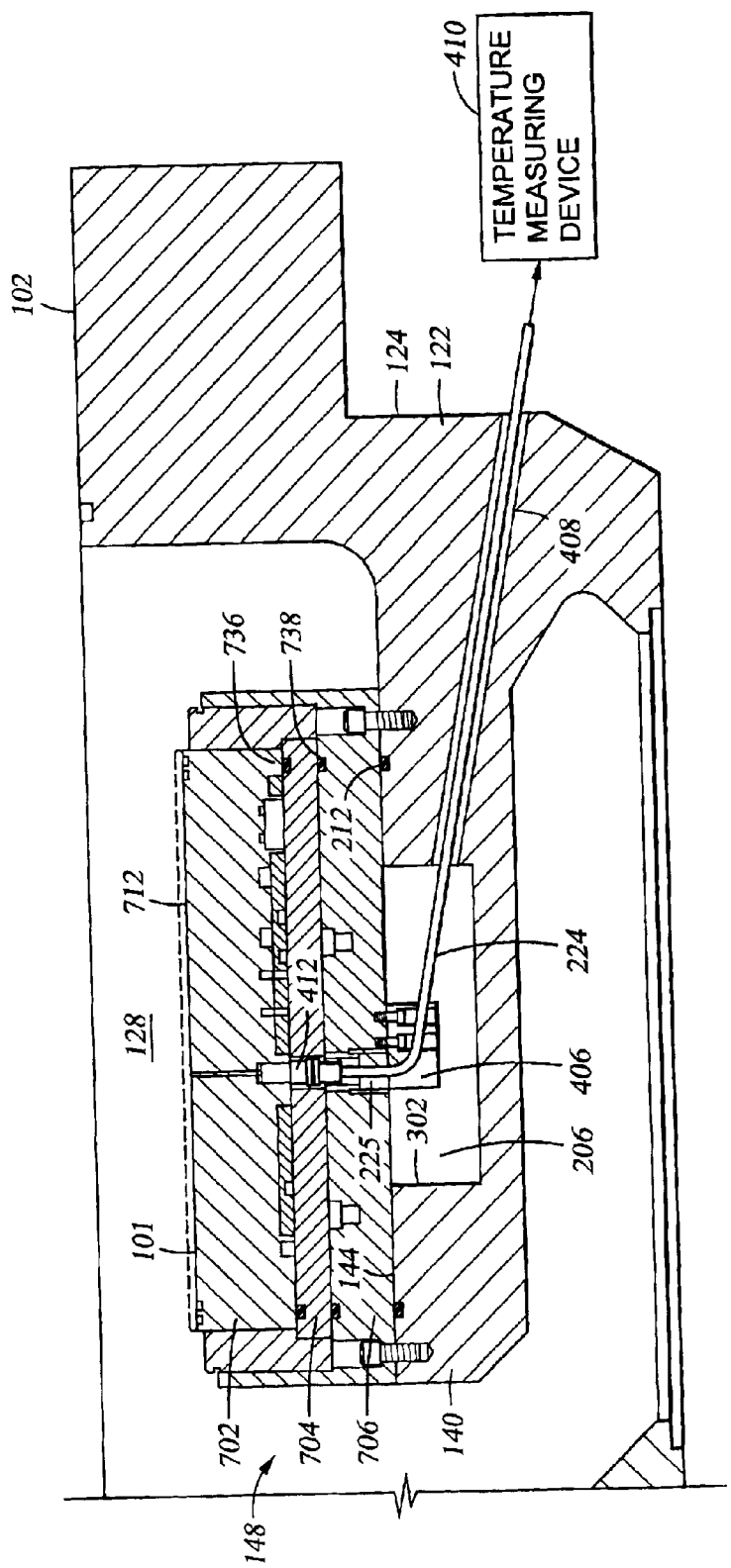
FIG. 4 depicts a cross sectional view of the chamber body having a wafer temperature probe cable as taken along section line 4—4 of FIG. 2.
Figure 5:
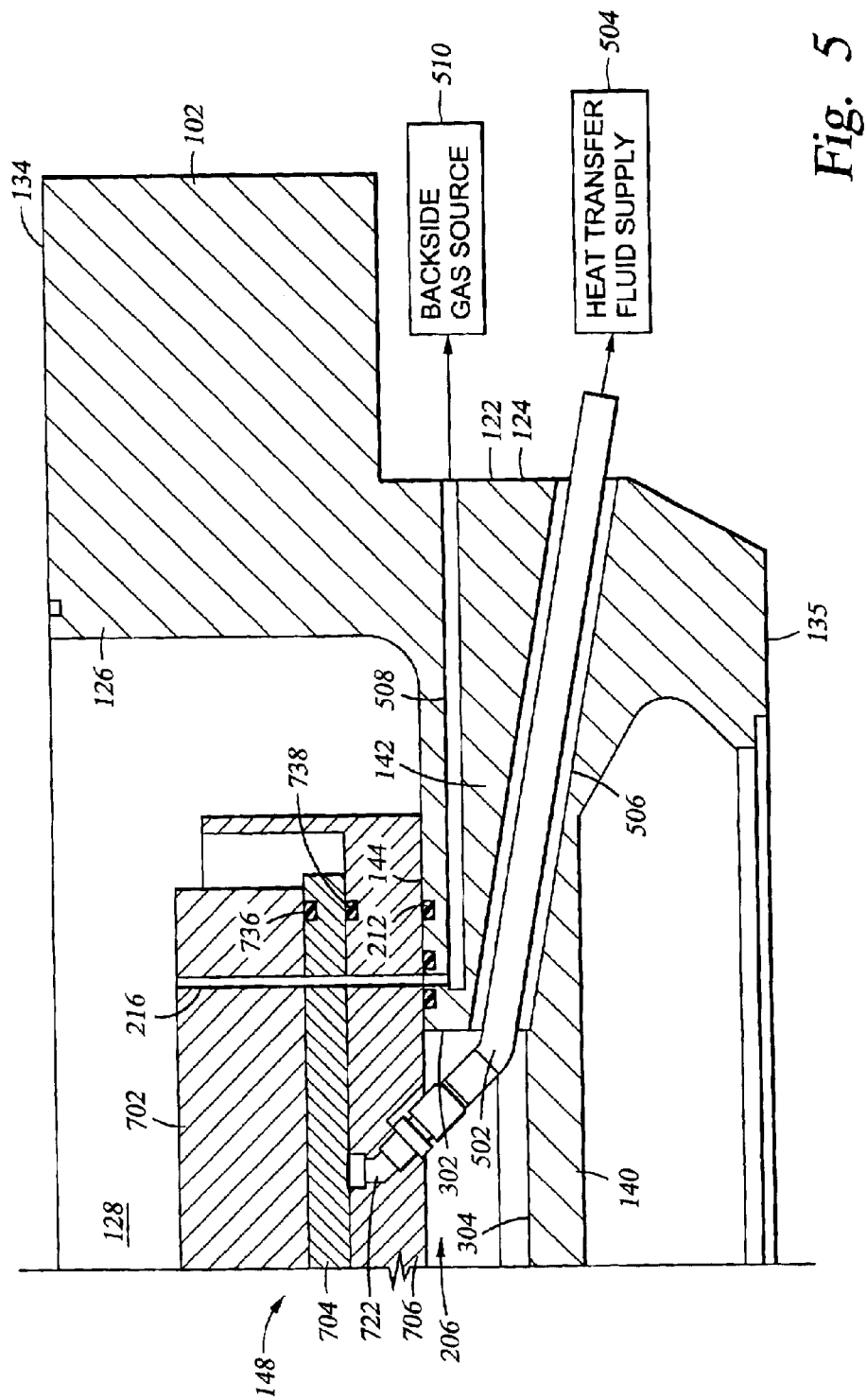
FIG. 5 depicts a cross sectional view of the chamber body having a fluid supply line and a backside gas supply line as taken along section line 5—5 of FIG. 2.
Figure 6:
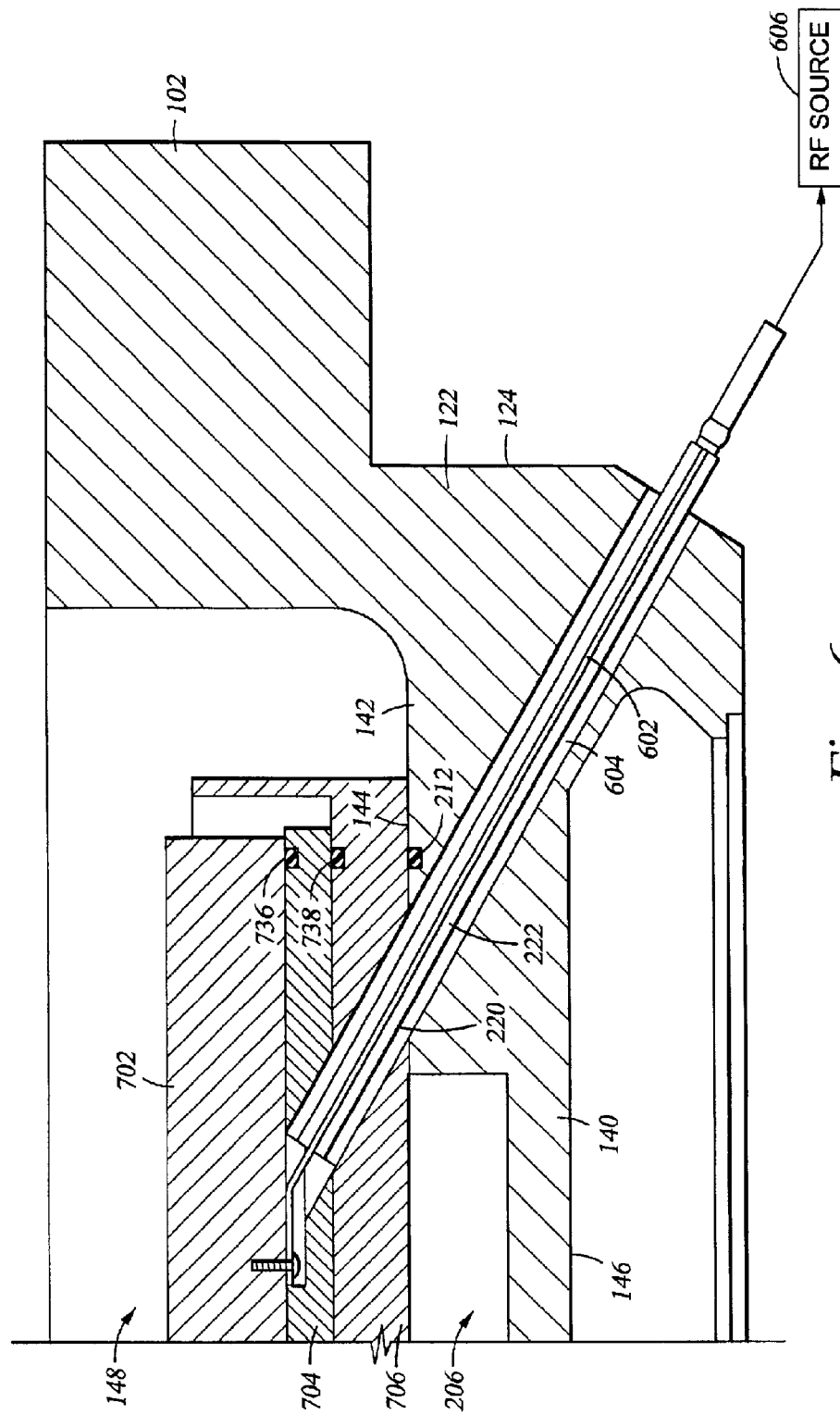
FIG. 6 depicts a cross sectional view of the chamber body having an RF cable as taken along section line 6—6 of FIG. 2.

FIGS. 4, 5, and 6 depict various components that interface with the substrate support assembly 148. FIG. 4 depicts a cross sectional view of the chamber body 102 having a wafer temperature probe cable 224 as taken along section line 4—4 of FIG. 2. Specifically, FIG. 4 depicts the wafer temperature probe cable 224 disposed in a cable conduit 408, which traverses a section of the chamber body 102. The wafer temperature probe cable 224 transfers signals between a temperature probe assembly 412 (i.e., temperature sensor) disposed in a probe channel 225 in the substrate support assembly 148 and an external temperature measuring device 410. The signals from the probe assembly 412 are converted into temperature measurements and utilized by the controller 110 for controlling the temperature of the substrate support assembly 148. The temperature probe assembly 412 and a first end 406 of the temperature probe cable 224 are positioned radially within the inner area of the plurality of lobed o-rings 212, 736, and 738. In this manner, the temperature probe assembly 412 and the first end 406 of the temperature probe cable 224 are isolated and protected from the processing environment.

FIG. 5 depicts a cross sectional view of the chamber body 102 having a fluid supply line 502, as taken along section line 5—5 of FIG. 2. Specifically, FIG. 5 depicts one of the pair of fluid supply lines 502 disposed in a fluid supply line conduit 506, which traverses a section of the chamber body 102 through the wall 302 and proximate the bottom 304 of the recess 206 of FIG. 3. The fluid supply lines 502 provide a heat transfer fluid (e.g., water) from a fluid supply 504 to fluid channels 722 housed in the base 706 of FIG. 7. One of the fluid supply line pairs transfers the fluid (i.e., coolant) to the base 706, while the other fluid supply line serves as a return. In this manner, a closed coolant circulatory system is provided. The fluid supply lines 502 are coupled to the base 706 and positioned radially within the inner area of the plurality of lobed o-rings 212, 736, and 738, thereby isolating and protecting the pair of fluid supply lines 502 from the processing environment.

FIG. 5 further depicts a cross sectional view of the chamber body 102 having a backside gas supply line 508 as taken along section line 5—5 of FIG. 2. The gas supply lines 508 provide conduits for a heat transfer gas (e.g., helium) from a gas source 510, through a pair of corresponding gas passages 216 disposed in the substrate support assembly 148 (see FIG. 2), and to the underside of the wafer 101. The gas supply lines 508 are coupled to the gas passages 216 and positioned radially within the inner area of the plurality of lobed o-rings 212, 736, and 738, thereby isolating and protecting the gas supply lines 508 and backside gas passages 216 from the processing environment.

FIG. 6 depicts a cross sectional view of the chamber body having an RF cable, as taken along section line 6—6 of FIG. 2. The RF cable 602 is partially disposed in a RF conduit 604 and provides RF power from a RF source 606 to bias the base 706 during processing. The RF cable 602 is coupled to the base 706 and positioned radially within the inner area of the plurality of lobed o-rings 212, 736, and 738, thereby isolating and protecting the RF cable 602 from the processing environment.

For a detailed understanding of the substrate support assembly 148, backside gas supply lines 402, wafer temperature probe cable 224, fluid supply lines 502, and RF cable 602, the reader should refer to the drawings and the detailed description in commonly assigned U.S. application titled "Chemical Vapor Deposition Chamber", by Gujer et al., Ser. No. 09/707,211, Docket No. 4352-3/PDD/KPU3/JW, filed-concurrently with this application, and incorporated herein by reference. That patent teaches a substrate support assembly having a centrally disposed recess as well as various support assembly components coupled thereto, which is manufactured by Applied Materials, Inc. of Santa Clara, Calif.

Although the teachings of the present invention that have been shown and described in detail herein, those skilled in the art can readily devise other varied embodiments that still incorporate the teachings and do not depart from the spirit of the invention.

What is claimed is:

1. A semiconductor wafer processing substrate support assembly, comprising:
   a substrate support platform having a centrally disposed recess formed in an upper surface of said support platform; and
   a first sealing member having a plurality of lobes, the first sealing member circumscribing said centrally disposed recess;
   a base disposed above said centrally disposed recess, wherein said first sealing member is disposed between said base and said substrate support platform;
   a plate disposed above and in contact with said base; and
   a substrate support disposed above and in contact with said plate.

2. The support assembly of claim 1 wherein said centrally disposed recess is defined by a plurality of walls extending from said upper surface of said support platform to a bottom of said support platform.

3. The support assembly of claim 2 wherein said upper surface of said support platform comprises a groove circumscribing said centrally disposed recess for receiving said first sealing member.

4. The support assembly of claim 1 wherein said first sealing member is adapted to isolate an internal environment formed within said centrally disposed recess from an external semiconductor wafer processing environment.

5. The support assembly of claim 4 wherein said external semiconductor wafer processing environment is formed in a processing chamber housing said support assembly.

6. The support assembly of claim 1 wherein a second sealing member having a plurality of lobes is disposed between said base and said plate.

7. The support assembly of claim 6 wherein a third sealing member having a plurality of lobes is disposed between said plate and said substrate support.

8. The support assembly of claim 7 wherein said first, second, and third sealing members are clover shaped.

9. The support assembly of claim 7 wherein said first, second, and third sealing members are fabricated from a fluoropolymer.

10. The support assembly of claim 7 wherein a plurality of lift-pin holes extend through said bottom surface of said support platform to said upper surface of said substrate support, wherein said first, second, and third sealing members extend radially inward of said plurality of lift-pin holes.

11. The support assembly of claim 7 wherein at least one of said first, second, and third sealing members circumscribe a RF cable disposed in an RF conduit.

12. The support assembly of claim 7 wherein at least one of said first and second sealing members circumscribe a pair of fluid supply lines disposed in a pair of fluid supply line conduits.

13. The support assembly of claim 7 wherein at least one of said first, second, and third sealing members circumscribe a wafer temperature probe cable disposed in a temperature monitor cable channel.

14. The support assembly of claim 7 wherein at least one of said first, second, and third sealing members circumscribe at least one backside gas passage coupled to at least one backside gas supply line.

15. A semiconductor wafer processing chamber, comprising:
   a substrate support platform having a centrally disposed recess;
   a base disposed above said centrally disposed recess;
   a plate disposed above said base;
   a substrate support disposed above said plate;
   a plurality of lobed sealing members disposed between the base, plate, and substrate support.

16. The processing chamber of claim 15 wherein a first lobed sealing member of said plurality of lobed sealing members is disposed between said support platform and said base, a second lobed sealing member is disposed between said base and said plate, and a third lobed sealing member is disposed between said plate and said substrate support.

17. The processing chamber of claim 15 wherein at least one platform arm extending radially from a sidewall of said processing chamber to said substrate support platform.

18. The processing chamber of claim 15 wherein said centrally disposed recess is defined by a plurality of walls extending from a first surface of said support platform to a bottom of said support platform.

19. The processing chamber of claim 17 wherein said first surface of said support platform comprises a groove circumscribing said centrally disposed recess for receiving said first lobed sealing member.

20. The processing chamber of claim 19 wherein a plurality of lift-pin holes extend from a lower surface of said support platform to an upper surface of said substrate support wherein said plurality of lobed sealing members extend radially inward of said plurality of lift-pin holes.

21. The processing chamber of claim 15 wherein said plurality of lobed sealing members is fabricated from a fluoropolymer.

22. The processing chamber of claim 15 wherein at least one of said plurality of lobed sealing members circumscribe a RF cable disposed in the base.

23. The processing chamber of claim 15 wherein said first and second lobed sealing members circumscribe a pair of fluid supply lines disposed in the base.

24. The processing chamber of claim 15 wherein at least one of said plurality of lobed sealing members circumscribe at least one backside gas supply line coupled to at least one backside gas passage disposed in the base.

25. The processing chamber of claim 15 wherein at least one of said plurality of lobed sealing members circumscribe a temperature sensor coupled to a temperature probe cable disposed in the base.

* * * * *